United States Patent
Kalafala et al.

(10) Patent No.: US 7,987,440 B2
(45) Date of Patent: Jul. 26, 2011

(54) METHOD AND SYSTEM FOR EFFICIENT VALIDATION OF CLOCK SKEWS DURING HIERARCHICAL STATIC TIMING ANALYSIS

(75) Inventors: Kerim Kalafala, Rhinebeck, NY (US); Jennifer E. Basile, Poughkeepsie, NY (US); David J. Hathaway, Underhill, VT (US); Pooja M. Kotecha, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 363 days.

(21) Appl. No.: 12/351,944

(22) Filed: Jan. 12, 2009

(65) Prior Publication Data

US 2010/0180242 A1 Jul. 15, 2010

(51) Int. Cl.
*G06F 17/50* (2006.01)
(52) U.S. Cl. ........ 716/108; 716/105; 716/106; 716/134; 703/19
(58) Field of Classification Search .................. 716/105, 716/106, 108, 134; 703/19
See application file for complete search history.

(56) References Cited

U.S. PATENT DOCUMENTS

| | | | |
|---|---|---|---|
| 7,103,863 B2 | 9/2006 | Riepe et al. | |
| 7,243,320 B2 * | 7/2007 | Chiu et al. | 716/106 |
| 7,243,323 B2 * | 7/2007 | Williams et al. | 716/113 |
| 7,428,716 B2 * | 9/2008 | Visweswariah | 716/113 |
| 7,624,364 B2 * | 11/2009 | Albrecht et al. | 716/113 |
| 2005/0177357 A1 * | 8/2005 | Amatangelo et al. | 703/16 |
| 2006/0247906 A1 * | 11/2006 | Austin et al. | 703/16 |
| 2008/0209373 A1 * | 8/2008 | Buck et al. | 716/6 |

* cited by examiner

*Primary Examiner* — Naum Levin
(74) *Attorney, Agent, or Firm* — H. Daniel Schnurmann

(57) ABSTRACT

A method and a system for validating clock skews during a hierarchical static timing analysis of a chip or multi-chip package. Each pair of clock inputs of a hierarchical module bounds the allowable clock skew, creating new relative constraints on clock input arrival times propagated to those clock inputs. One embodiment is based on asserted arrival times and a maximum of computed slack values at said clock inputs, while a second embodiment is based on asserted arrival times and a minimum of downstream test slack values. The method further converts module clock assertions into a set of relative timing constraints to allow a hierarchical timing sign-off even in circumstances where absolute timing arrivals are not totally known at the time of module analysis.

11 Claims, 7 Drawing Sheets

METHOD AND SYSTEM FOR EFFICIENT VALIDATION OF CLOCK SKEWS DURING HIERARCHICAL STATIC TIMING ANALYSIS

FIELD OF THE INVENTION

The present invention generally relates to the field of Design Automation of semiconductor chips and multi-chip packages, and more particularly, to a system and method for efficiently validating clock skews during hierarchical static timing analysis.

BACKGROUND OF THE INVENTION

The goal of static timing analysis (STA) is to determine the latest and earliest possible switching times of various signals within a digital circuit. STA may generally be performed at the transistor level or at the gate level, using precharacterized library elements, or at higher levels of abstraction, for complex hierarchical chips and/or multi-chip packages.

STA algorithms operate by first levelizing the logic structure, and breaking any loops in order to create a directed acyclic graph (timing graph). Modern designs can often contain millions of placeable objects, with corresponding timing graphs having millions, if not tens of millions of nodes. For each node, a corresponding arrival time, transition rate (slew), and required arrival time are computed for both rising and falling transitions as well early and late mode analysis. An arrival time (AT) represents the latest or earliest time at which a signal can transition due to the entire upstream fan-in cone. The slew value is the transition rate associated with a corresponding AT, and a required arrival time (RAT) represents the latest or earliest time at which a signal must transition due to timing constraints in the entire downstream fan-out cone.

AT's are propagated forward in a levelized manner, starting from the design primary input asserted (i.e., user-specified) arrival times, and ending at either primary output ports or intermediate storage elements. For single fan-in cases,

*AT* sink node=*AT* source node+delay from source to sink.

Whenever multiple signals merge, each fan-in contributes a potential arrival time computed as

*AT* sink (potential)=*AT* source+delay, making it possible for the maximum (late mode) or minimum (early mode) of all potential arrival times to be retained at the sink node. Typically an exact delay value for an edge in a timing graph is not known, but instead only a range of possible delay values can be determined between some minimum delay and maximum delay. In this case, maximum delays are used to compute late mode arrival times and minimum delays are used to compute early mode arrival times.

RATs are computed in a backward levelized manner starting from either asserted required arrival times at the design primary output pins, or from tests (e.g., setup or hold constraints) at internal storage devices. For single fan-out cases,

*RAT* source node=*RAT* sink node−delay.

When multiple fan-outs merge (or when a test is present), each fan-out (or test) contributes a prospective RAT, enabling the minimum (late mode) or maximum (early mode) required arrival time to be retained at the source node. When only a range of possible delay values can be determined, maximum delay are used to compute late mode required arrival times and minimum delays are used to compute early mode required arrival times.

The difference between the arrival time and required arrival time at a node (i.e., RAT−AT in late mode, and AT−RAT in early mode) is referred to as slack. A positive slack implies that the current arrival time at a given node meets all downstream timing constraints, and a negative slack implies that the arrival time fails at least one such downstream timing constraint. A timing point may include multiple such AT, RAT, and slew values, each denoted with a separate tag, in order to represent data associated with different clock domains (i.e., launched by different clock signals), or for the purpose of distinguishing information for a specific subset of an entire fan-in cone or fan-out cone.

Clock skew refers to the difference in arrival times between a given pair of clock inputs. Considering the case of a setup test, a slack can be computed as:

Capture clock arrival time at test−data arrival time at test−setup time+cycle adjust which can also be expressed in terms of capture and launching clock arrival times as follows:

Capture clock input arrival time+capture clock input to test delay−Launching clock input arrival time−Launching clock to test delay−setup time+cycle adjust Grouping terms, it becomes:

(Capture clock input arrival time−Launching clock input arrival time)+Capture clock input to test delay−Launching clock input to test delay−setup time+cycle adjust.

Therefore, it is evident that the slack at a given test depends on the skew between the launching and capturing clock inputs as expressed by the term (Capture clock input arrival time−Launching clock input arrival time).

Due to increasing design sizes, hierarchical static timing analysis techniques are becoming popular in order to divide analysis of a large design in to smaller and more manageable segments. In one style of hierarchical analysis, a design is partitioned into various modules which are analyzed independently (also referred hereinafter as "out of context" analysis), using asserted input arrival times and output required arrival times. A reduced abstract model is subsequently generated which may remove internal latch to latch logic, and full design timing is subsequently performed using reduced abstract models. In order to verify that internal logic continues to operate correctly in the full design level timing environment (i.e., all slacks in the original logic will be greater than zero, or a user-specified threshold), clock arrival times need to be examined to check for excessive skew which may lead to an internal timing failure.

Prior art approaches to the aforementioned problem are described, for instance, in U.S. Pat. No. 7,103,863 to Riepe et al., in which, a method for performing hierarchical static timing analysis is set forth whereby asserted arrival times at hierarchical inputs are translated in to absolute required arrival times for top-level timing. However, such approaches are pessimistic for clock validation in that they do not take in to account relative timing considerations. For example, in situations where multiple clock signals arrive at a hierarchical module, internal timing constraints may still be met in cases where all clock inputs are offset by the same amount relative to the out-of-context timing assertions, since in this scenario the relative skew between said clock inputs is constant (even though absolute arrival times have changed).

Another approach for hierarchical static timing analysis is described in "A Comprehensive Solution for True Hierarchical Timing and Crosstalk Delay Signoff" to Sivakumar, et. al., in which budgeted clock skew values are used to perform hierarchical timing sign off. In this approach, a particular clock skew is assumed during out-of-context validation, and then a corresponding clock skew test is performed during top-level timing to ensure consistency. This technique, however, does not take in to account any available positive slack observed during out-of-context timing analysis in order to relax skew constraints for top-level timing, and therefore can lead to pessimistic over-design.

Accordingly, there is a need for a system and a method for efficiently validating clock skews during hierarchical static timing analysis, which reduces pessimism as compared to prior art techniques while still ensuring that all internal timing constraints will continue to be satisfied.

SUMMARY OF INVENTION

In one aspect of the present invention there is provided a system and a method for validating clock skews during hierarchical static timing analysis of chips and multi-chip packages. Each pair of clock inputs bounds the allowable clock skew by creating new relative constraints on the propagated clock input arrival times. The system converts module clock assertions into a set of relative timing constraints, making it possible to hierarchically validate timing even in circumstances where the absolute clock arrival times are not completely known at the time of the module analysis.

In another aspect of the invention, a method and a system are provided to compute skew test guard times. Included are one embodiment based on asserted arrival times and a maximum of computed slack values, and a second embodiment based on computed required arrival times. Unlike prior art techniques, no topological tracing is required in order to pull back tests from internal latch points to primary inputs.

In yet another aspect of the invention, there is provided a method for conducting a static timing analysis on a circuit having at least one hierarchical module, the method including the steps of: a) asserting clock input arrival times for at least one the hierarchical modules; b) for at least one pair of clock inputs, determining a clock input slack based on propagating the asserted clock input arrival times and determining the largest allowable clock skew as a function of the clock input slack and asserted arrival times at the clock inputs, and c) performing a top-level analysis of the at least one hierarchical design, during which, for at least one pair of clock signals, the largest allowable clock skew is compared against the actual clock skew.

BRIEF DESCRIPTION OF DRAWINGS

The accompanying drawings, which are incorporated in and which constitute part of the specification, illustrate the presently preferred embodiments of the invention which, together with the general description given above and the detailed description of the preferred embodiments given below serve to explain the principles of the invention.

DETAILED DESCRIPTION OF EMBODIMENTS OF THE INVENTION

The present invention and various features, aspects and advantageous details thereof are explained more fully with reference to the non-limiting embodiments that are illustrated in the accompanying drawings and detailed in the following description.

Figure 1:
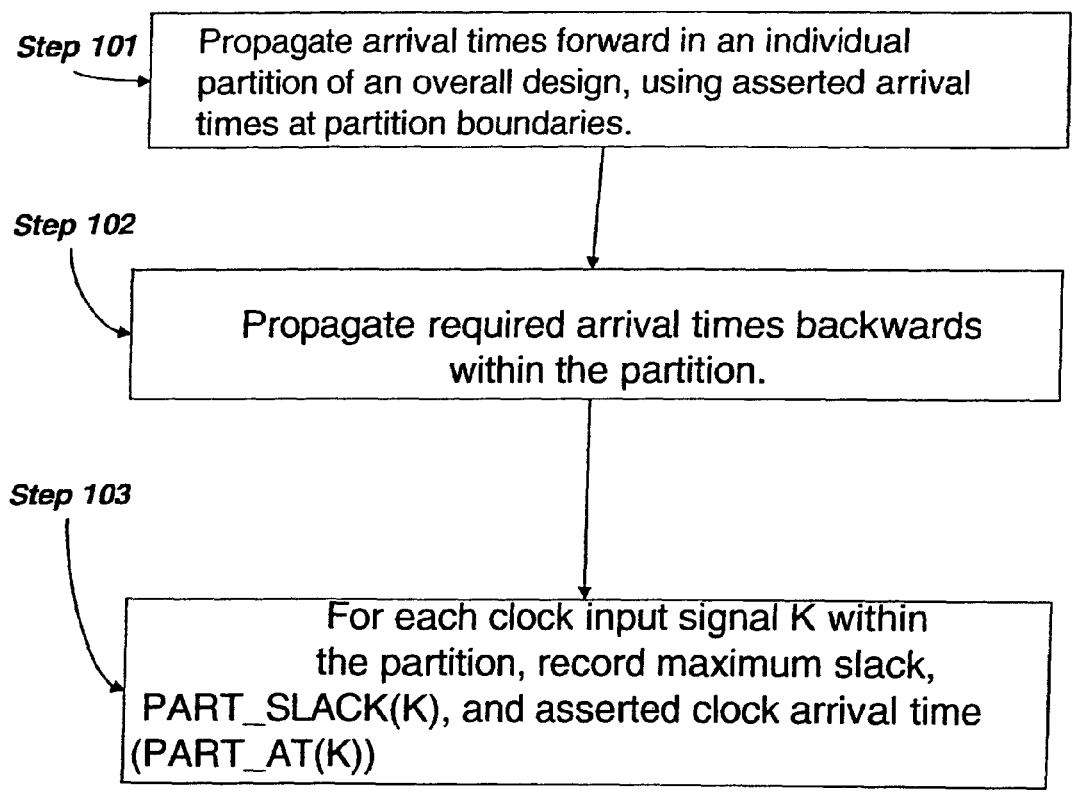
FIGS. 1 and 2 show two flowcharts illustrating a first embodiment of the present invention wherein relative clock skews are validated in a top-level timing environment, taking in to account available positive slack as measured at clock primary inputs during out of context timing.
Figure 2:
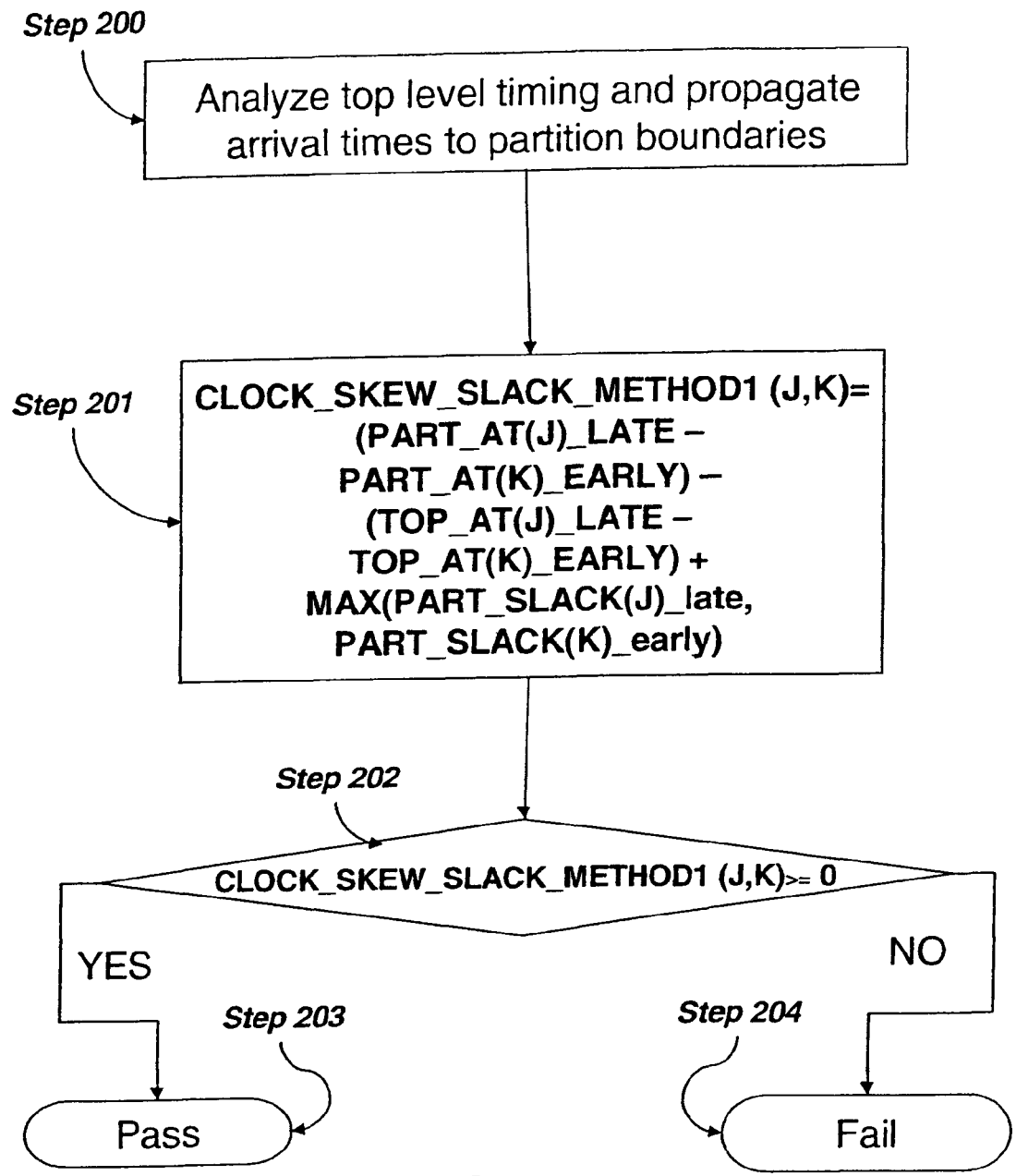

FIGS. 1 and 2 show two flowcharts which jointly illustrate an embodiment of the present invention. Relative clock skews are validated in a top-level timing environment, taking into account the available positive slack as measured at clock primary inputs of hierarchical partitions of the top-level design during out of context timing.

In order to further appreciate the present methodology and details thereof, initially several illustrative examples will be provided in conjunction with the various steps of the present invention as embodied by the two flowcharts.

Referring to FIG. 1, in Step 101, a top-level design is initially partitioned and arrival times are propagated forward on each individual partition using asserted times at the partition boundaries.

In Step 102, the required arrival times within the partition are now propagated in an opposite direction.

In Step 103, for each clock input signal K within the partition, a maximum slack (henceforth referred to as PART_SLACK(K)) is determined and recorded, as well as the asserted clock arrival time, which for illustrative purposes is referred to hereinafter as PART_AT(K).

Referring to FIG. 2, still referring to the first embodiment, in Step 200, a top level timing analysis is performed and propagation arrival times to the partitioned boundaries are determined. The top-level analysis may occur in a separate process from the detailed timing analysis of the lower-level hierarchical modules.

Figure 7:
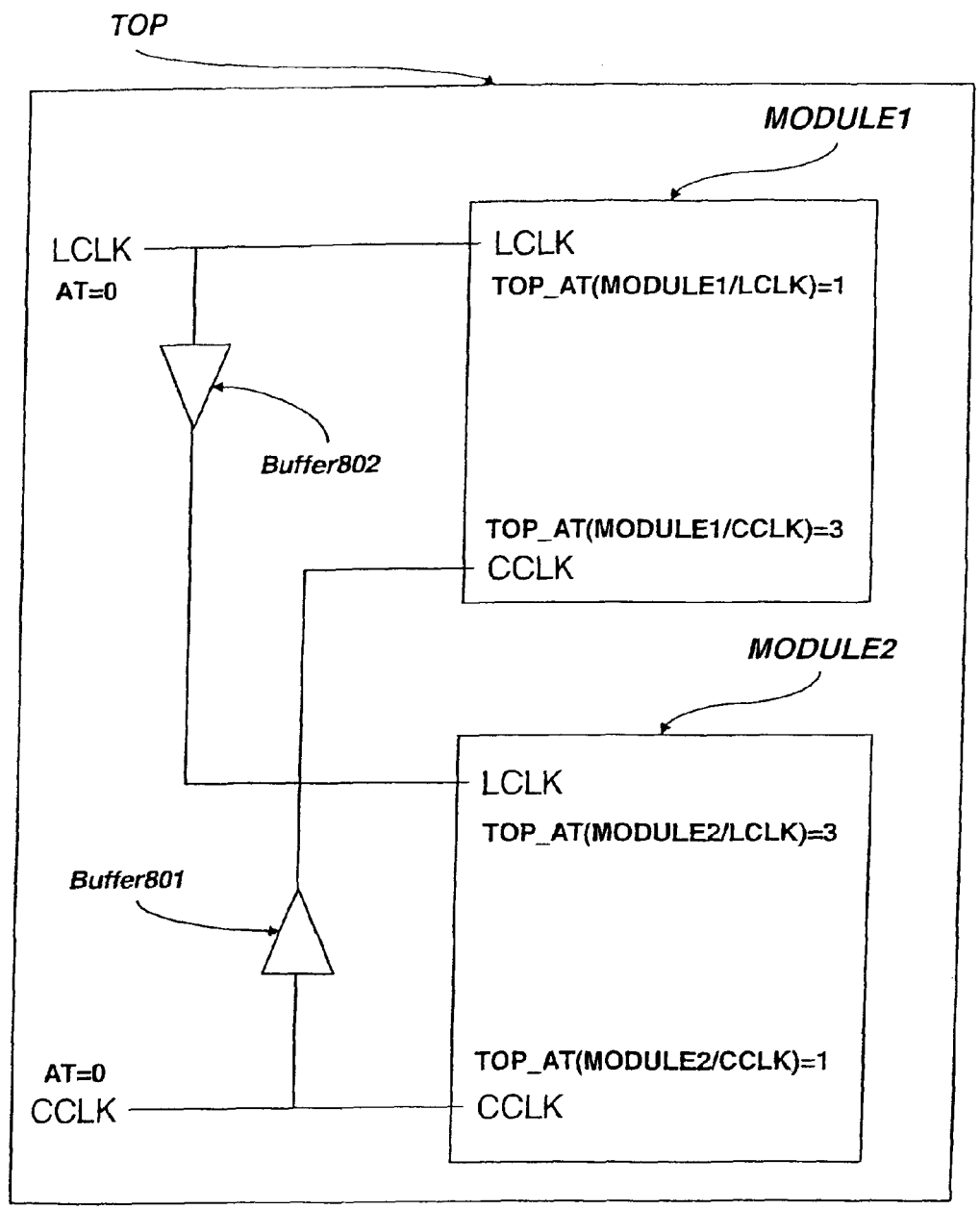
FIG. 7 illustrates an exemplary top-level design providing a demonstrative application of embodiments of the present invention.

To better understand the process described thus far, reference is made to the illustrative example shown in FIG. 7. Referring now to MODULE1, the arrival time of CCLK, labeled TOP_AT(CCLK), is assumed to be 3, while TOP_AT (LCLK) is assumed to be 1. At MODULE2, TOP_AT(CCLK) and TOP_AT(LCLK) they are 1 and 3, respectively. Note that each instance of a MODULE within the top-level design generally may have a unique set of arrival times computed at clock inputs due to variations in the clock skew, as well as other design considerations.

Figure 5:
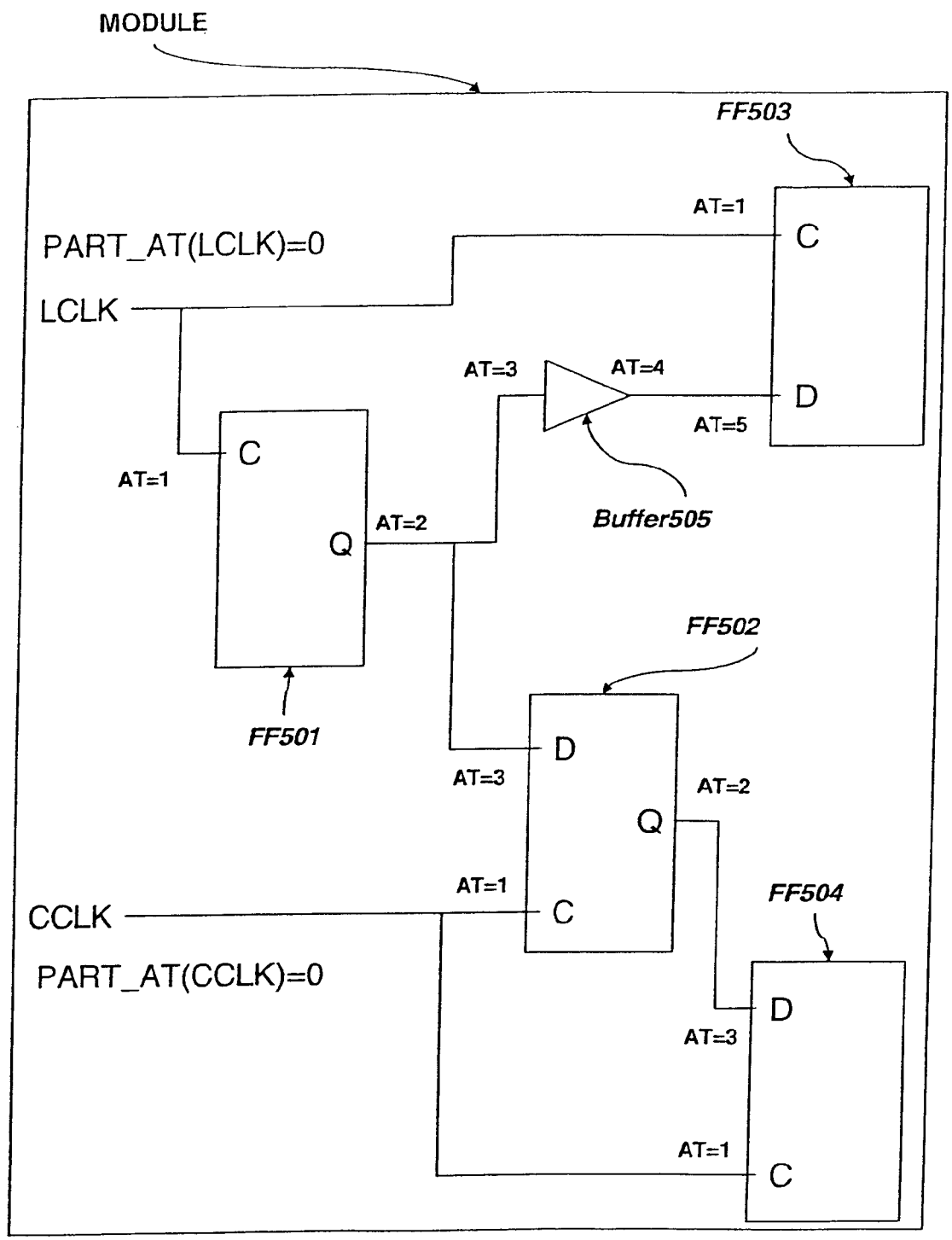
FIGS. 5 and 6 illustrate an exemplary module-level design providing a demonstrative application of embodiments of the present invention.

Referring now to FIG. 5, a demonstrative example of an illustrative circuit is shown that includes a hierarchical entity (labeled MODULE) within a larger top-level design, and which consists of two primary input clock pins LCLK and CCLK, edge-triggered (non-transparent) flip-flops FF501, FF502, FF503, FF504, and buffer 505. Each stage of logic and wire delay is presumed to have a delay of 1 time unit (e.g., nanosecond). Furthermore each latch is assumed to have a setup and hold test having a guard time of 0, and an overall cycle time assumed to be 5 time units (e.g., nanoseconds). In the present example, all setup tests are presumed to be adjacent-cycle checks, and therefore receive full cycle (5 time unit) additional test adjust. Moreover, all hold tests are assumed to be same-cycle checks and therefore receive zero additional tests adjust. Similarly, and without loss of generality, primary input node CCLK is supposed to have a user-specified late mode and early mode ATs of zero PART_AT (CCLK)=0. The primary input node LCLK is supposed to have user-specified early and late mode ATs of zero PART_AT(LCLK)=0 as well. The exact arrival times at CCLK and LCLK may not necessarily be known at the time when analyzing the current partition due to a multiplicity of factors including: partition reuse (same partition may be instantiated several times within a higher-level design), process variability, and uncertainty with regards to the final design implementation of the top-level clock tree, and thus user-specified assertions may be used as a proxy for the computed arrival times which may not be precisely known at the time of out-of-context hierarchical analysis, due to the variabilities described above.

Still referring to FIG. 5, the arrival times from the various nodes in the illustrative hierarchical module are first propagated during an initial static timing analysis (FIG. 1, Step 101). In the demonstrative circuit early and late mode primary input ATs and minimum and maximum delays coincide. Only a single path exists to each internal pin within the module, so internal pin early and late mode ATs are also the same. For clarity, only a single AT value is shown for each pin. In general, the early and late ATs for any or all internal pins may differ. Required arrival times are then propagated backwards from primary outputs (not shown in the exemplary design) and tests to the primary inputs as specified in FIG. 1, Step 102 and further with reference to FIG. 6, slack values are recorded at primary inputs, as specified in FIG. 1, Step 103. PART_SLACK_EARLY(CCLK) represents the early slack computed at clock input CLK=+2, and PART_SLACK_LATE(CCLK)=+2. Similarly, PART_SLACK_EARLY (LCLK)=+2 and PART_SLACK_LATE(LCLK)=+1.

Referring back to FIG. 7, the exemplary top-level design example shows two instances of the hierarchical entity MODULE. These instances are referred to as MODULE1 and MODULE2. For illustrative purposes, and without loss of generality, each stage of logic and wire delay is presumed to have a delay of 1 time unit (e.g., nanosecond). It is further assumed that all primary inputs of the top-level design are assigned an arrival time of 0. During the top-level static timing analysis, the computed arrival times (TOP_AT values) are propagated to MODULE1 and MODULE2 inputs CCLK and LCLK. The early and late mode primary input ATs and minimum and maximum delays are the same, and only a single path exists to each module clock pin, so the module clock input early and late mode ATs are also the same and only a single AT value is shown for each. In general the early and late ATs for any or all internal pins might differ.

As previously described, it is known that slack at an internal storage element can be computed as a function of clock skew. In an embodiment of the present invention, for a given pair of clock inputs, the actual clock skew observed during top-level analysis is compared against the maximum allowable clock skew which guarantees all internal slacks will remain positive. It is a further embodiment of the present invention that the maximum allowable skew can be computed by taking the clock skew applied in the out-of-context analysis, and then adding to this value the maximum positive slack seen at either of said clock inputs. Referring back to FIG. 2, in step 201, the aforementioned comparison of clock skew values can be expressed as a slack metric computed as:

CLOCK_SKEW_SLACK_METHOD1(CCLK, LCLK)=[PART_AT_LATE(CCLK)-PART_AT_EARLY(LCLK)]-[TOP_AT_LATE (CCLK)-TOP_AT_EARLY(LCLK)]+MAX (PART_SLACK_LATE(CCLK), PART_SLACK_EARLY(LCLK).

Figure 6:
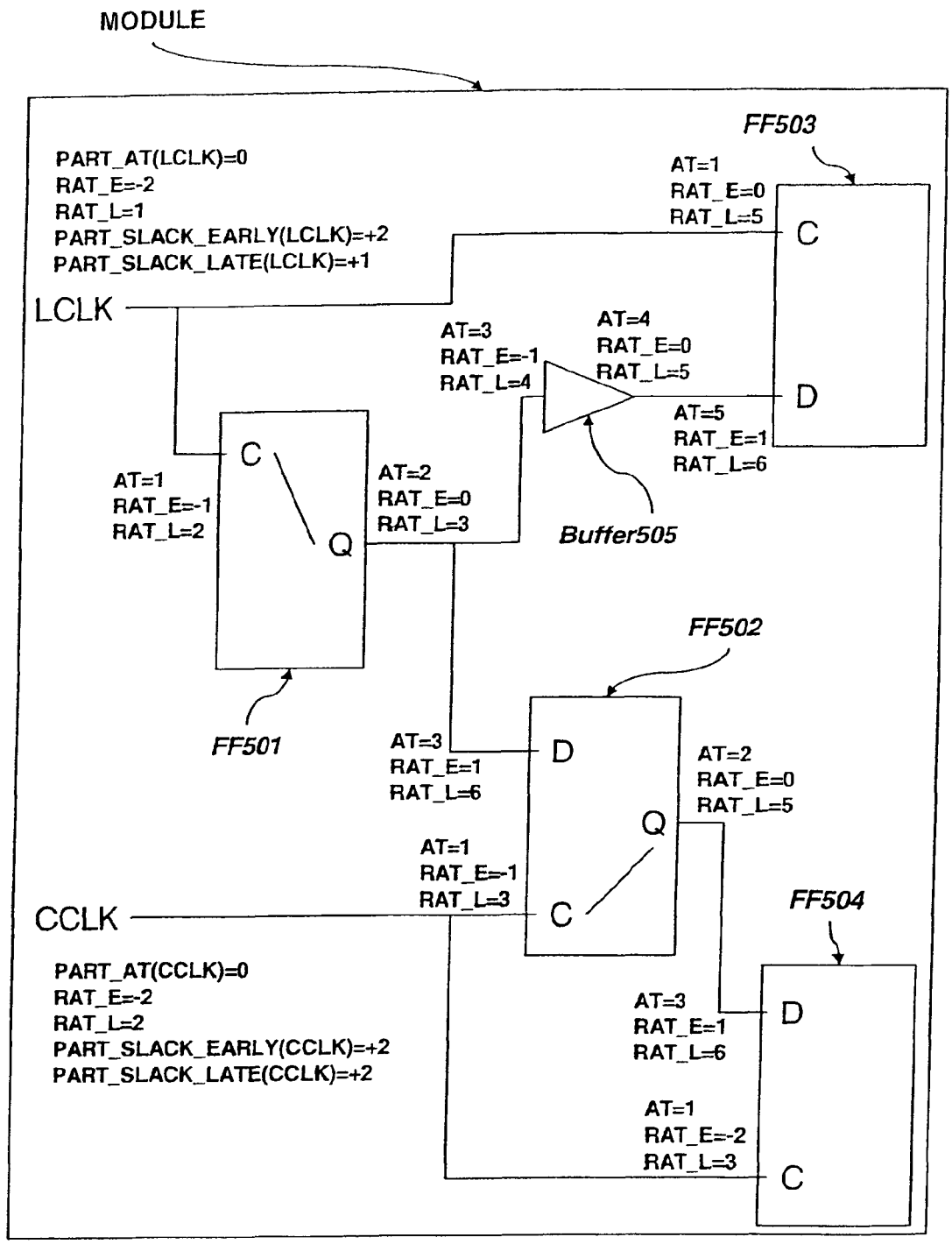

In the case of MODULE1, and referring to the numerical values illustrated in FIGS. 6 and 7:

CLOCK_SKEW_SLACK_METHOD1_MODULE1 (CCLK,LCLK)=[0-0]-[3-1]+MAX(2,2)=0.

In step 202, since CLOCK_SKEW_SLACK_MODULE1(CCLK,LCLK)≥0, the clock skew test passes (FIG. 2, step 203), implying that no timing violations is introduced in MODULE1 due to the late mode LCLK clock input interacting with the early mode CCLK clock input. Similarly, CLOCK_SKEW_SLACK_METHOD1(LCLK, CCLK) is computed as CLOCK_SKEW_SLACK_METHOD1_MODULE1 (LCLK, CCLK)=[PART_AT_LATE(LCLK)-PART_AT_EARLY(CCLK)]-[TOP_AT_LATE (LCLK)-TOP_AT_EARLY(CCLK)]+MAX (PART_SLACK_LATE(LCLK), PART_SLACK_EARLY(CCLK).

Inserting numerical values:

CLOCK_SKEW_SLACK_METHOD1_MODULE1 (LCLK,CCLK)=[0-0]-[1-3]+MAX(1,2)=+4.

Referring back to FIG. 2, step 202, since

CLOCK_SKEW_SLACK_METHOD1_MODULE1 (CCLK,LCLK)≥0, the clock skew test passes (Step 203), implying that no timing violations will be introduced within MODULE1 due to interaction of the late mode LCLK clock input with the early mode CCLK clock input.

Note that the novel clock skew metric determines that timing constraints internal to MODULE1 will continue to pass, even though the arrival times propagated to MODULE1 are more pessimistic (e.g., larger in late mode) than the arrival times asserted in out-of-context analysis. Furthermore, the absolute clock skew as seen during top-level analysis is also greater than the difference in asserted arrival time (skew) during out-of-context analysis, whereas prior art methods would have (pessimistically) flagged the clock skew at MODULE1 as a violation.

A novel clock skew slack metric may also be computed for MODULE2, to which a different set of arrival times are propagated to clock inputs CCLK and LCLK due to a differences in the clock tree configuration feeding MODULE2 as compared to MODULE1.

For MODULE2,

CLOCK_SKEW_SLACK_METHOD1_MODULE2 (CCLK, LCLK)=[PART_AT_LATE(CCLK)-PART_AT_EARLY(LCLK)]-[TOP_AT_LATE (CCLK)-TOP_AT_EARLY(LCLK)]+MAX (PART_SLACK_LATE(CCLK), PART_SLACK_EARLY(LCLK)=[0-0]-[1-3]+ MAX(2,2)=+4.

Similarly,

CLOCK_SKEW_SLACK_METHOD1_MODULE2 (LCLK, CCLK)=[PART_AT_LATE(LCLK)-PART_AT_EARLY(CCLK)]-[TOP_AT_LATE (LCLK)-TOP_AT_EARLY(CCLK)]+MAX (PART_SLACK_LATE(LCLK), PART_SLACK_EARLY(CCLK)=[0-0]-[3-1]+ MAX(1,2)=0

Again, since CLOCK_SKEW_SLACK_METHOD1_MODULE2 (CCLK,LCLK), and CLOCK_SKEW_SLACK_MODULE2(LCLK,CCLK)≥0, all clock skew tests pass (FIG. 2, step 203) for MODULE2, implying that no timing violations will be introduced in MODULE1 due to a late (early) LCLK clock input interaction with the early (late) mode CCLK clock input. This represents a less pessimistic treatment of clock skews when compared to the prior art, which would have (pessimistically) flagged a violation at MODULE2 due to the fact that the measured clock skew at MODULE2 is larger than the skew applied during out of context analysis of the original MODULE hierarchical entity.

Figure 3:
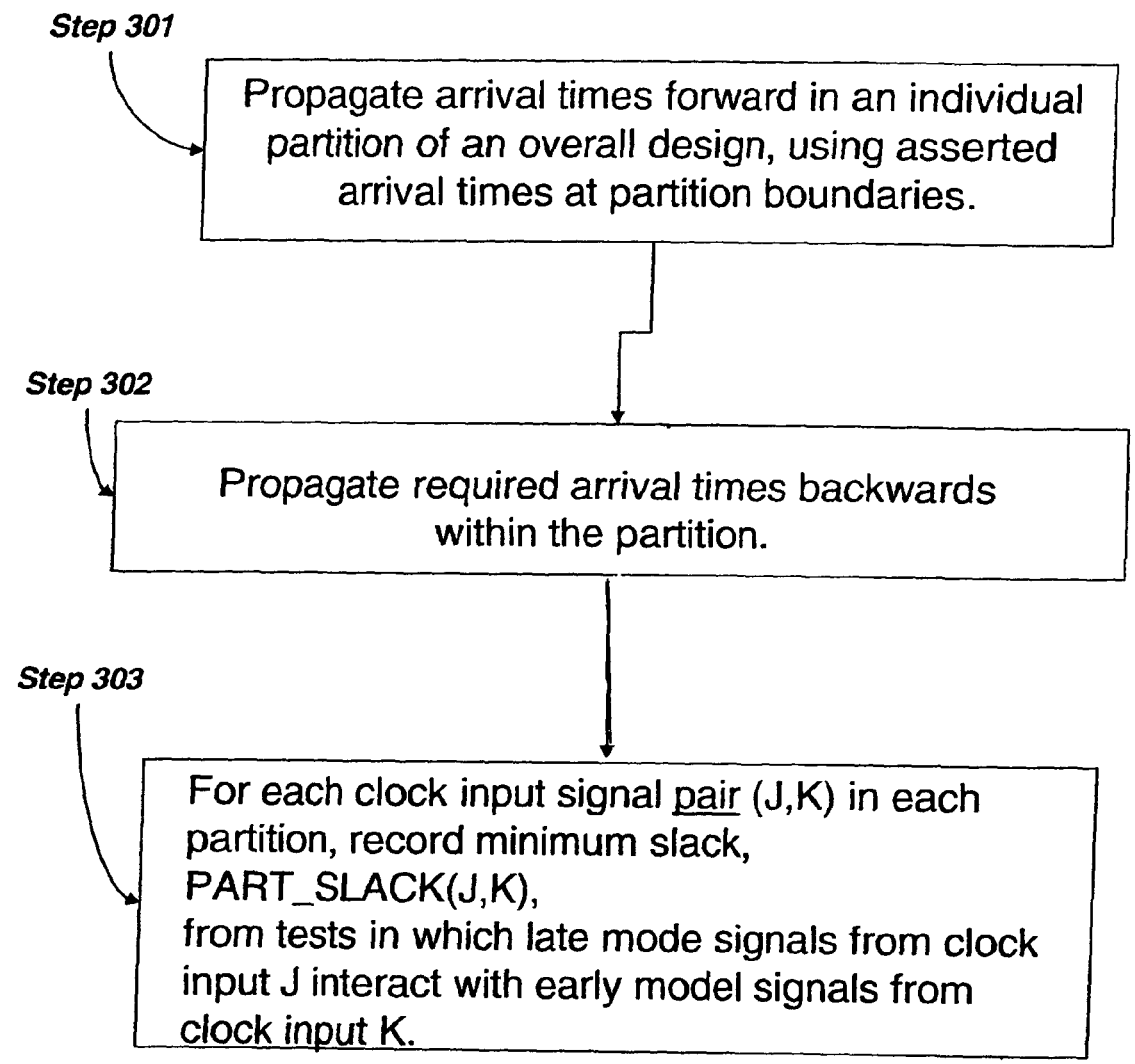
FIGS. 3 and 4 show two flowcharts illustrating a second embodiment of the present invention whereby relative clock skews are validated in a top-level timing environment, taking in to account available positive slack as measured at individual tests during out of context timing.

Referring to FIG. 3, a second embodiment of the present invention is illustrated.

An out-of-context partition analysis is first performed by propagating arrival times forward in step 301, based on asserted clock input arrival times, and then propagating required arrival times backwards from tests and primary outputs in step 302. In the exemplary design, these propagated values are the same as computed by step 101 of method 1, shown in FIGS. 5 and 6.

In step 303, for each pair of clock inputs (J,K), PART_SLACK(J,K) is determined by identifying the worst slack situation where a late mode signal derived from clock input J interacts (i.e., is tested against) an early mode signal derived from clock input K. A detailed example will be described hereinafter with reference to the illustrative examples shown in FIGS. 5 through 7.

PART_SLACK(CCLK,LCLK) corresponds to the minimum slack of the hold test at FF502 and the hold test at FF504, or min(2, 2)=+2. Similarly, PART_SLACK(LCLK, CCLK) corresponds to the minimum slack of the setup test at FF502 and the setup test at FF504, or min(3, 3)=+3. Pair-wise PART_SLACK values may be computed, for example, using either explicit topological tracing, propagation of additional tags from primary inputs, or other means to distinguish test values due to selected clock interactions.

In Step 400, a top level timing analysis is performed and arrival times are propagated forward as illustrated in aforementioned FIG. 7.

Figure 4:
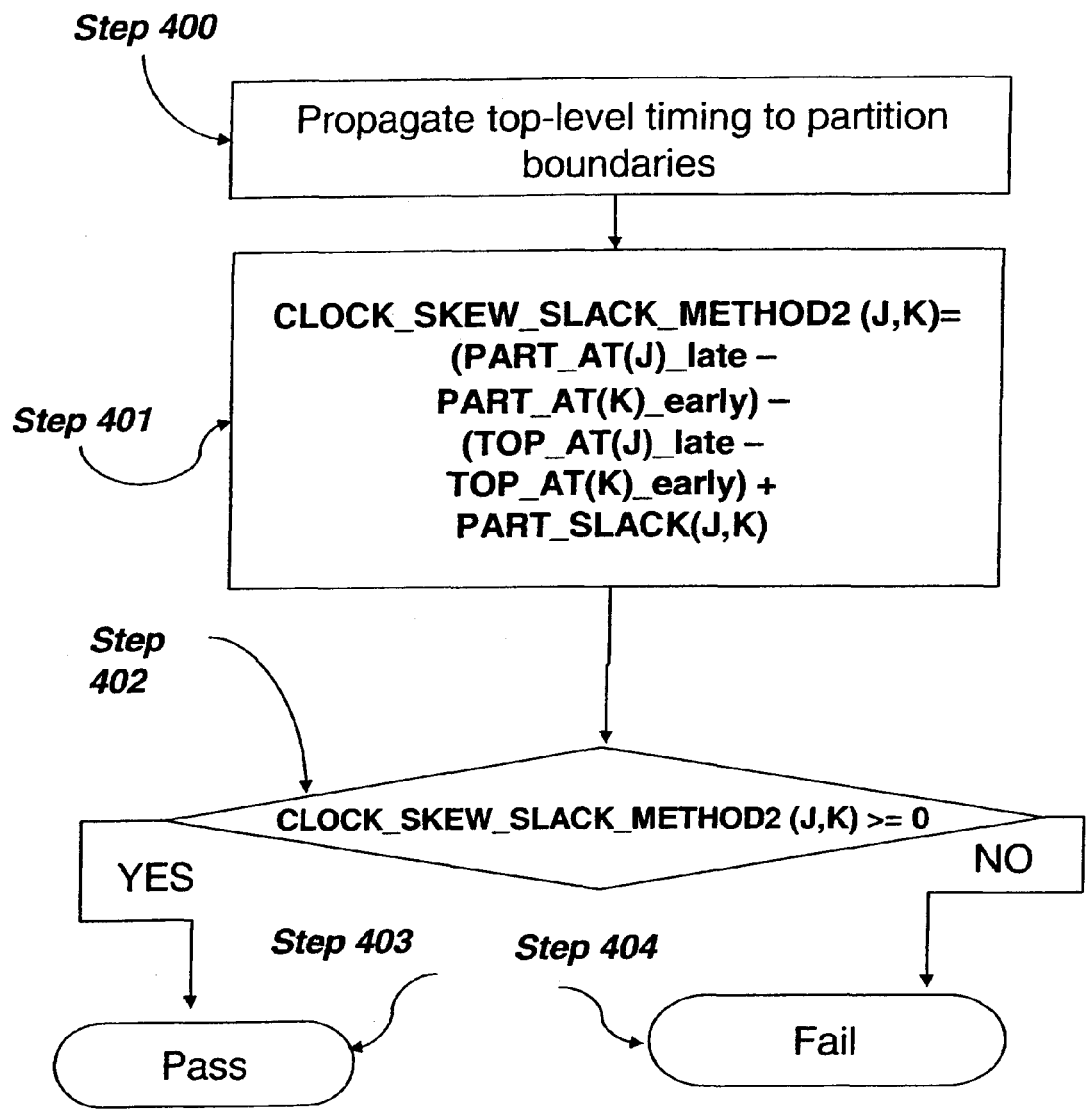

Referring to FIG. 4, the analysis of the top-level design by the second embodiment of the present invention is shown. As previously described, it is known in the art that the slack at an internal storage element can be computed as a function of clock skew. As in the first embodiment of the present invention, for a given pair of clock inputs, the actual clock skew observed during top-level analysis is compared against the maximum allowable clock skew which guarantees all internal slacks will remain positive. In the second embodiment of the present invention, however, the maximum allowable skew can be computed by taking the clock skew applied in the out-of-context analysis, and then adding to this value the maximum positive slack seen at all tests fed by both said clock inputs.

In Step 401, a clock skew metric is computed taking in to account aforementioned pair-wise PART_SLACK(J,K) values (Step 303). A corresponding illustrative example will be detailed hereinafter with reference to FIGS. 5 through 7.

Now, focusing initially on MODULE1,

CLOCK_SKEW_SLACK_METHOD2_MODULE1
(CCLK,LCLK)=(PART_AT(CCLK)_late−PART_AT(LCLK)_early)−(TOP_AT(CCLK)_late−TOP_AT(LCLK)_early)+PART_SLACK(CCLK, LCLK)=[0−0]−[3−1]+2=0.

Continuing with the illustrative example for MODULE1,

CLOCK_SKEW_SLACK_METHOD2_MODULE1
(LCLK,CCLK)=(PART_AT(LCLK)_late−PART_AT(CCLK)_early)−(TOP_AT(LCLK)_late−TOP_AT(CCLK)_early)+PART_SLACK(LCLK, CCLK)=[0−0]−[1−3]+3=+5.

Since both CLOCK_SKEW_SLACK_METHOD2_MODULE1 (CCLK,LCLK), and CLOCK_SKEW_SLACK_METHOD2_MODULE1 (LCLK,CCLK)≥0, all the clock skew tests pass (Step 403, FIG. 4) for MODULE1, implying that no timing violations will be introduced within MODULE1 due to an interaction of late (early) LCLK clock input with the early (late) mode CCLK clock input. Furthermore, note in particular that the second embodiment using pairwise PART_SLACK(J,K) values may provide additional positive CLOCK_SKEW_SLACK as compared to the aforementioned first embodiment using MAX(PART_SLACK(J), PART_SLACK(K)).

In the present illustrative example,

CLOCK_SKEW_SLACK_METHOD2_MODULE1
(LCLK,CCLK)=5>
CLOCK_SKEW_SLACK_METHOD1_MODULE1
(LCLK,CCLK)=4.

Since CLOCK_SKEW_SLACK_METHOD1 provides a conservative bound (though still less conservative than prior art methods) on the allowable clock skew, it would possible to use the first embodiment as a fast filter to determine the set of clock input pairs which are guaranteed to pass. In such an iterative filtering approach, any clock input pairs which fail the CLOCK_SKEW_SLACK_METHOD1 metric can be analyzed in more detail using CLOCK_SLEW_SLACK_METHOD2.

Finally, for MODULE2

CLOCK_SKEW_SLACK_METHOD2_MODULE2
(CCLK,LCLK)=(PART_AT(CCLK)_late−PART_AT(LCLK)_early)−(TOP_AT(CCLK)_late−TOP_AT(LCLK)_early)+PART_SLACK(CCLK, LCLK)=[0−0]−[1−3]+2=+4, and CLOCK_SKEW_SLACK_METHOD2_MODULE1
(LCLK,CCLK)=(PART_AT(LCLK)_late−PART_AT(CCLK)_early)−(TOP_AT(LCLK)_late−TOP_AT(CCLK)_early)+PART_SLACK(LCLK, CCLK)=[0−0]−[3−1]+3=+1.

Since both CLOCK_SKEW_SLACK_METHOD2_MODULE2 (CCLK,LCLK), and CLOCK_SKEW_SLACK_METHOD2_MODULE2 (LCLK,CCLK)≥0, all clock skew tests pass (FIG. 4, step 403) for MODULE2, implying that no timing violations will be introduced within MODULE2 due to an interaction of late (early) LCLK clock input with the early (late) mode CCLK clock input. Furthermore, note in particular that the second embodiment using pair-wise PART_SLACK(J,K) values may provide additional positive CLOCK_SKEW_SLACK as compared to the aforementioned first embodiment using MAX(PART_SLACK(J), PART_SLACK(K)). For example, in the present illustrative example, CLOCK_SKEW_SLACK_METHOD2_MODULE2
(LCLK,CCLK)=1>
CLOCK_SKEW_SLACK_METHOD1_MODULE2
(LCLK,CCLK)=0.

The present invention can be realized in hardware, software, or a combination of hardware and software. The present invention can be realized in a centralized fashion in one computer system or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods.

Computer program means or computer program in the present context mean any expression, in any language, code or notation, of a set of instructions intended to cause a system having an information processing capability to perform a particular function either directly or after conversion to another language, code or notation and/or reproduction in a different material form.

While the present invention has been particularly described in conjunction of a simple illustrative embodiment, it is to be understood that one of ordinary skill in the art can extend and apply this invention in many obvious ways. While the illustrative example shows a small circuit and a small corresponding timing graph, the invention applies to circuits and graphs of any size. In the illustrative example, for purposes of clarity, rising and falling timing quantities were not differentiated, but one of ordinary skill in the art could apply the present invention to a situation with different rising and falling delays, slews, ATs and RATs. The invention applies to any type of static timing, including but not limited to deterministic or statistical static timing of gate-level circuits, transistor-level circuits, hierarchical circuits, circuits with combinational logic, circuits with sequential logic, timing in the presence of coupling noise, timing in the presence of multiple-input switching, timing in the presence of arbitrary timing tests such as setup, hold, end-of-cycle, pulse width, clock gating and loop-cut tests, and timing in the presence of multiple clock domains. It is also to be understood that while the flowcharts shown focus mainly on a single pair of clock inputs constraint, other embodiments of the invention can be adapted to any number of such clock inputs simultaneously, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A method for conducting a static timing analysis on a top-level design having at least one hierarchical module, the method comprising:
    using a computer system for:
    asserting arrival times on a plurality of clock inputs of at least one of said hierarchical modules;
    for at least one pair of the plurality of clock inputs, determining a clock input slack based on propagating the asserted clock input arrival times and determining a largest allowable clock skew as a function of said asserted arrival times at said clock inputs, and
    performing a top-level analysis of the at least one hierarchical design, during which said largest allowable clock skew of said at least one pair of clock signals is used to compute a clock skew slack.

2. The method according to claim 1 wherein said clock input slack is the maximum slack measured at said pair of clock inputs.

3. The method according to claim 1 wherein said clock input slack is a minimum slack among all tests fed by both of said pair of clock inputs.

4. The method according to claim 1 wherein said clock inputs comprise rising and falling arrival times.

5. The method according to claim 1 wherein said propagating said asserted clock input arrival times includes propagating early and late model clock arrival times.

6. The method according to claim 1, wherein said at least one pair of clock signals is ordered, and said clock skew slack is dependent on said ordering.

7. The method according to claim 6, wherein said computation of said clock skew slack includes using early mode arrival times propagated from a first of said pair of clock inputs and late mode arrival times propagated from a second of said clock inputs.

8. The method according to claim 1 wherein said static timing analysis includes gate-level timing.

9. The method according to claim 1 wherein said static timing analysis includes transistor-level timing.

10. The method according to claim 1 wherein said static timing analysis includes propagating statistical distributions.

11. A program storage device readable by a machine, tangibly embodying a program of instructions executable by the machine to perform method steps for conducting a static timing analysis on a top-level design having at least one hierarchical module, the method comprising:
    asserting arrival times on a plurality of clock inputs of at least one said hierarchical modules for at least one pair of the plurality of clock inputs;
    determining a clock input slack based on propagating asserted clock input arrival times;
    determining a largest allowable clock skew as a function of said asserted arrival times at said clock inputs; and
    performing a top-level analysis of the hierarchical design, during which said largest allowable clock skew of said at least one pair of clock signals is used to compute a clock skew slack.

* * * * *